(12) United States Patent
Wu (10) Patent No.: US 7,459,925 B1
(45) Date of Patent: Dec. 2, 2008

(54) PROBE CARD

(75) Inventor: Shun-Ker Wu, Taoyuan (TW)

(73) Assignee: Nanya Technology Corp., Kueishan, Tao-Yuan Hsien (TW)

(*) Notice: Subject to any disclaimer, the term of this patent is extended or adjusted under 35 U.S.C. 154(b) by 0 days.

(21) Appl. No.: 12/043,136

(22) Filed: Mar. 6, 2008

(30) Foreign Application Priority Data

Nov. 12, 2007 (TW) .................................. 96142650

(51) Int. Cl.
*G01R 31/02* (2006.01)

(52) U.S. Cl. .................... 324/754; 324/761; 324/762

(58) Field of Classification Search ................ None
See application file for complete search history.

(56) References Cited

U.S. PATENT DOCUMENTS 7,154,285 B2 * 12/2006 Cheng ...................... 324/754

* cited by examiner

*Primary Examiner*—Minh N Tang
(74) *Attorney, Agent, or Firm*—Winston Hsu (57) ABSTRACT

A PCB of a probe card includes a first region, a second region, a third region and a fourth region arranged clockwise. The circuit pattern of the first region corresponds to the circuit pattern of the third region. The circuit pattern of the second region corresponds to the circuit pattern of the fourth region, wherein the circuit pattern of the first region is different from the circuit pattern of the second region.

11 Claims, 11 Drawing Sheets

PROBE CARD

BACKGROUND OF THE INVENTION

1. Field of the Invention

The present invention is related to a probe card, and more particularly, to circuit patterns positioned on a printed circuit board (PCB) of a probe card.

2. Description of the Prior Art

In the semiconductor industry, an integrated circuit (IC) is obtained by sequentially ongoing IC design, semiconductor processes, and fabrication of the IC etc. After completion of these procedures, a probing card is used to perform multi-probe processes by contacting bonding pads. Only the dies qualified in the test or repaired dies are entered into subsequent bonding and packaging processes, and the packaged dies must still undergo a final test for satisfaction check.

Generally speaking, testing devices require several main instruments such as probe cards, probers, testers. A probe card is an interface between an electronic test system and a device under test (DUT), for example, a tester and a die.

A prober is usually responsible for loading and unloading the DUT from its carrier and is equipped with automatic pattern recognition optics capable of aligning the DUT with sufficient accuracy to ensure accurate registration between the pads, such as bonding pads and the tips of the probe needles. A tester is responsible for sending electronic signals to the DUT. A picoprober can also be used to validate the accuracy of circuits on the DUT.

The probe card can be seen as an interface between the DUT and the tester. The circuit pattern on the PCB of the probe card has different designs according to DUTs with different IC designs. In addition, the probe card includes three different probe needle types: a top-side needle, a bottom-side needle and a both-side needle. In this way, the QC employee can test different regions on the DUT by the picoprober.

For a die with the same IC design, the PCB of a conventional probe card is specially designed for the top-side needle test and bottom-side needle test. However, when utilizing the both-side needle test, another PCB with a different design is needed for a conventional probe card.

Figure 1:
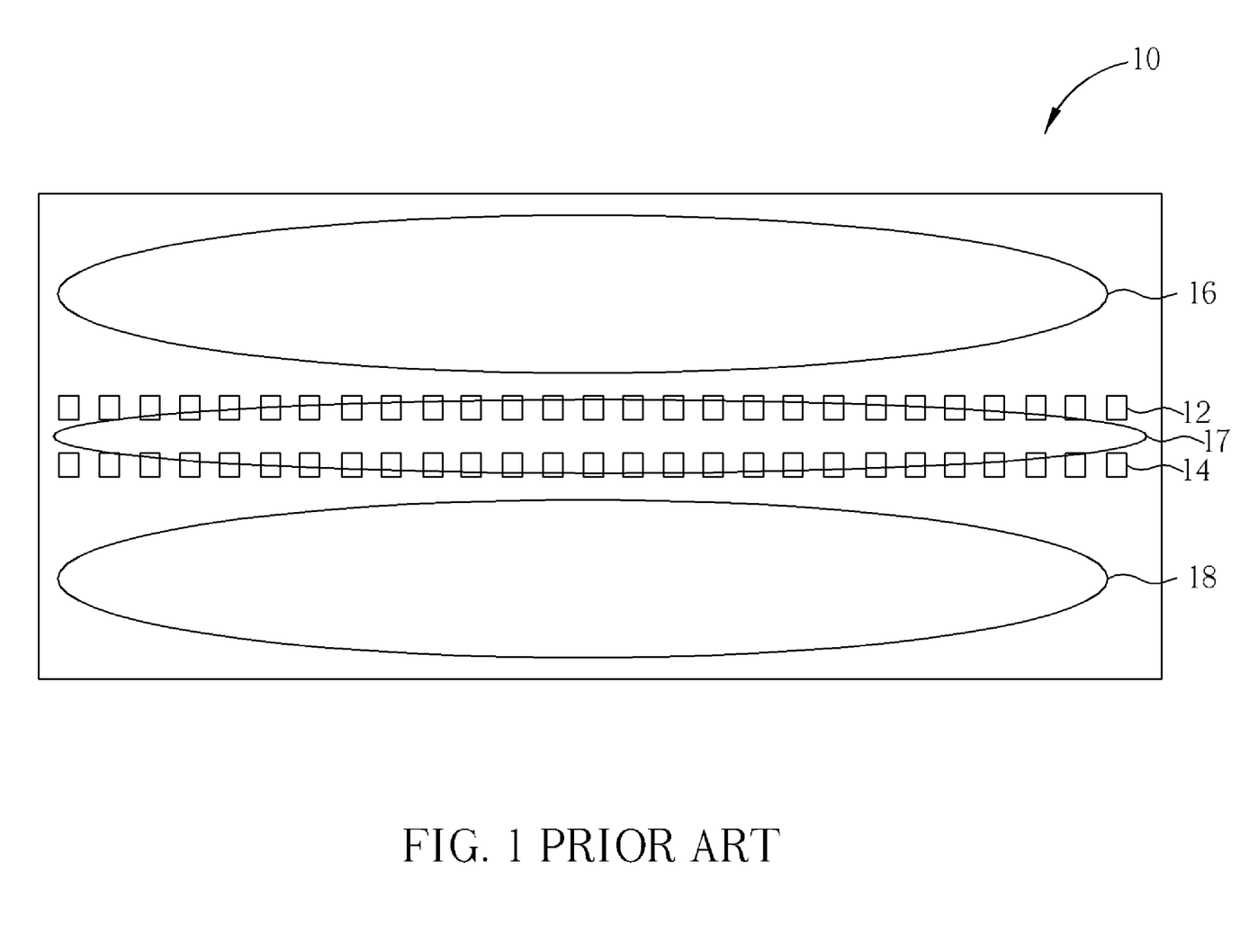
FIG. 1 depicts a die under test.
Figure 2A:
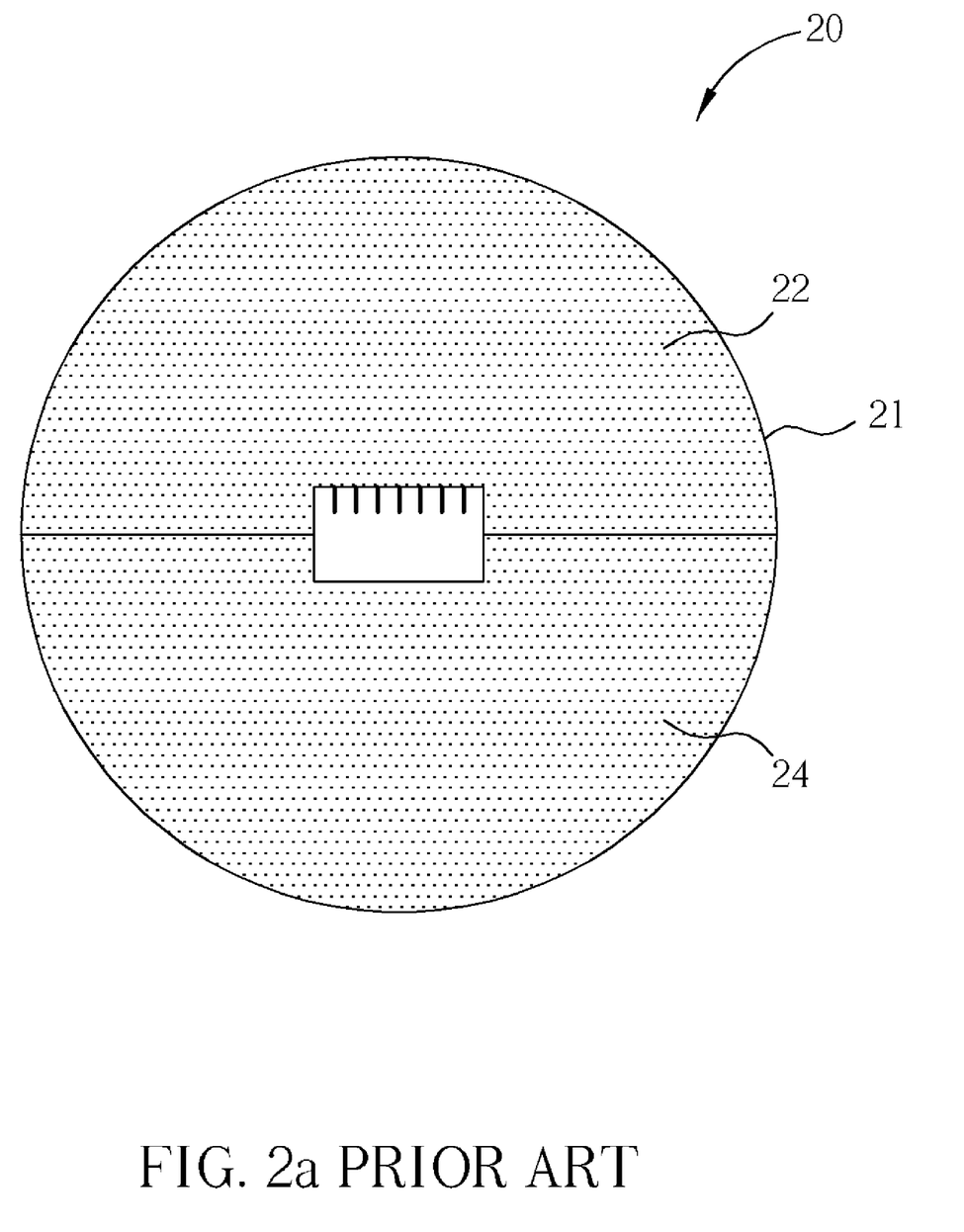
FIG. 2a depicts circuit patterns on the PCB of a probe card with a top-side needle or bottom-side needle according to the prior art.
Figure 2B:
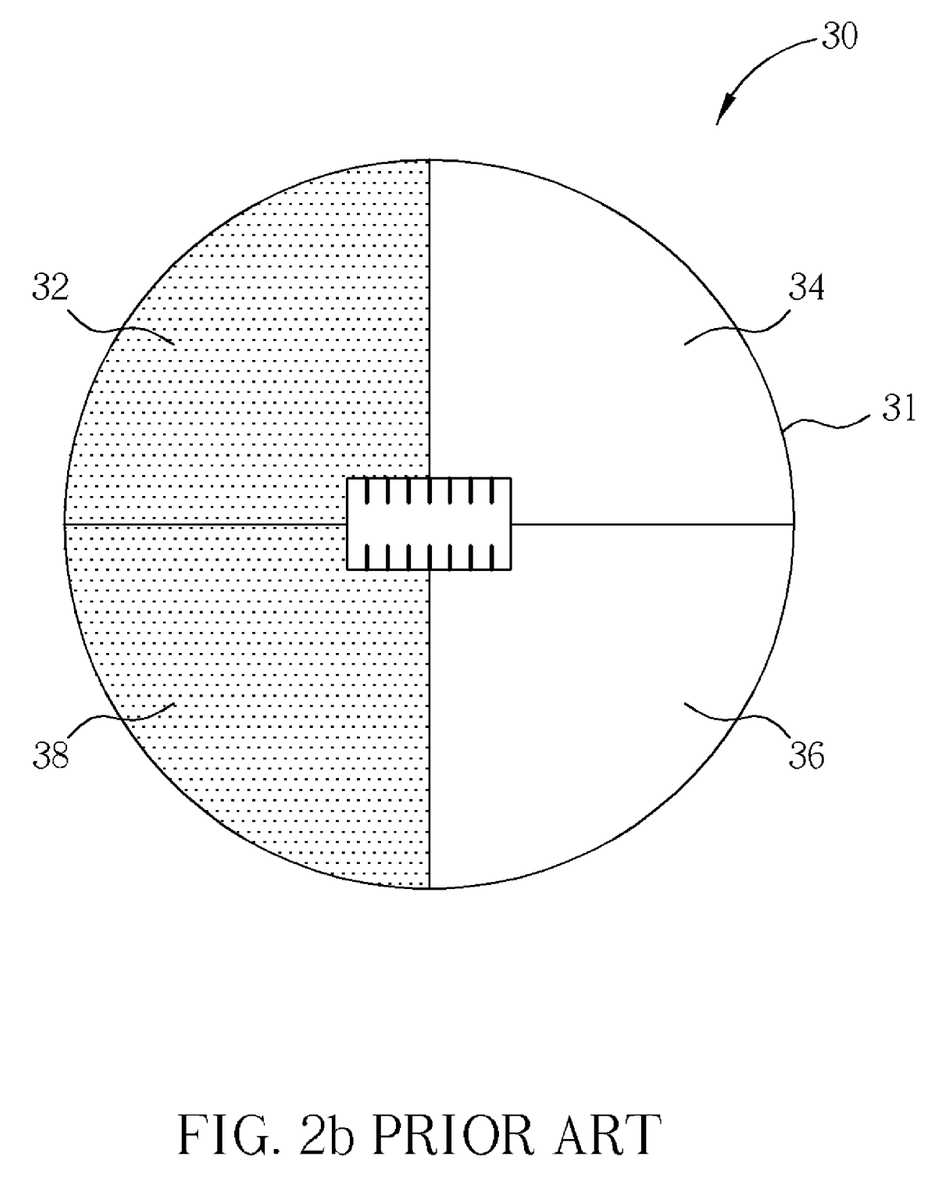
FIG. 2b depicts circuit patterns on the PCB of a probe card with a both-side needle according to the prior art.

FIG. 1 depicts a die 10 under test, wherein a first solder pad 12 and a second solder pad 14 are positioned on the die 10. According to the location of the first bonding pad 12 and the second bonding pad 14, the die 10 can be divided into regions 16, 17, 18. FIG. 2a depicts the circuit patterns on the PCB of the probe card with a top-side needle or bottom-side needle according to the prior art. FIG. 2b depicts the circuit patterns on the PCB of the probe card with a both-side needle according to the prior art.

Please refer to FIGS. 1 and 2a together. As shown in FIG. 2a, a PCB 21 on the probe card 20 is divided into regions 22, 24. The circuit pattern in the region 22 corresponds to the circuit connected to the first bonding pad 12 and the second bonding pad 14, wherein the circuit connected to the first bonding pad 12 and the second bonding pad 14 is interlaced in the region 22. In addition, the circuit pattern in the region 24 corresponds to the circuit pattern in the region 22.

The probe card 20 mentioned above is used for a top-side needle test and a bottom-side needle test. When running the top-side needle test, a plurality of cables will connect to the region 22 in order to connect the probe card 20 with a tester. In this way, the regions 16, 17 will be obstructed by the cables, therefore, the picoprober can only pin the region 18. When running the bottom-side needle test, a plurality of cables will connect to the region 24 in order to connect the probe card 20 with a tester. In this way, the regions 17, 18 will be obstructed by the cables, therefore, the picoprober can only pin the region 16. If the region 17 is tested by running the both-side needle test, the regions 22, 24 need to be connected to the cables. In this way, space for the picoprober is blocked by cables, so the region 17 may have a problem when undergoing the picoprober test.

Therefore, another probe card with a different PCB is needed in order to test the region 17. Please refer to FIGS. 1 and 2b together. As shown in FIG. 2b, a PCB 31 on the probe card 30 is divided into regions 32, 34, 36, 38. The circuit pattern in the region 32 corresponds to the circuit connected to the first bonding pad 12. The circuit pattern in the region 34 corresponds to the circuit connected to the second bonding pad 12. The circuit connected to the first bonding pad 12 is positioned separately from the circuit connected to the second bonding pad 14. Unlike the probe card 20, the circuit connected to the first bonding pad 12 and the circuit connected to the second bonding pad 14 are interlaced together. In addition, the circuit pattern in the region 38 corresponds to the circuit pattern in the region 32; the circuit pattern in the region 36 corresponds to the circuit pattern in the region 34. The probe card 30 mentioned above is used to run the both-side needle test according to the prior art. When testing the region 17, the regions 32, 34 are connected to cables, and the space on the regions 36, 38 can be spare for the picoprober. The region 17 can also be tested by connecting the regions 36, 38 to cables, and the space on the regions 32, 34 can be used by the picoprober.

However, according to the prior art, at least two different PCBs are needed for testing the same IC design, which is time consuming and expensive.

SUMMARY OF THE INVENTION

To solve the above-mentioned problem, a specially designed PCB circuit pattern on a PCB of a probe card is provided for running the top-side needle test, the bottom-side needle test and the both-side needle test. The PCB circuit pattern is compatible with the top-side needle test, the bottom-side needle test and the both-side needle test. Therefore, only one probe card with a specially designed PCB circuit pattern is needed to run the top-side needle test, the bottom-side needle test and the both-side needle test according to the present invention. The conventional probe card requires at least two PCBs with different PCB circuit patterns to run the top-side needle test, the bottom-side needle test and the both-side needle test. Therefore, the probe card provided in the present invention can save the cost of designing the PCB circuit pattern, and the cost of fabrication is also reduced.

In addition, when running the top-side needle test, the bottom-side needle test and the both-side needle test utilizing the probe card according to the present invention, the quality of sent and received signals can be improved, because only one PCB circuit pattern is used in running three needle tests. Therefore, the probe test can be more reliable. Furthermore, the way of running the picoprobe test in the present invention is compatible with the conventional method.

According to a preferred embodiment of the present invention, a probe card comprises a printed circuit board (PCB), wherein the PCB comprises a first region comprising a first circuit pattern, a second region comprising a second circuit pattern, a third region comprising a third circuit pattern, and a fourth region comprising a fourth circuit pattern, wherein the first region, the second region, the third region and the fourth region are arranged clockwise, and wherein the first circuit pattern corresponds to the third circuit pattern and the second circuit pattern corresponds to the fourth circuit pattern. The PCB also comprises a plurality of connectors positioned in the first region, the second region, the third region and the fourth region, where the connectors are connected to a tester electrically through a plurality of cables and an opening positioned in the center of the PCB. The probe card also comprises a plurality of probe needles, wherein the probe needles are coupled to the PCB electrically.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
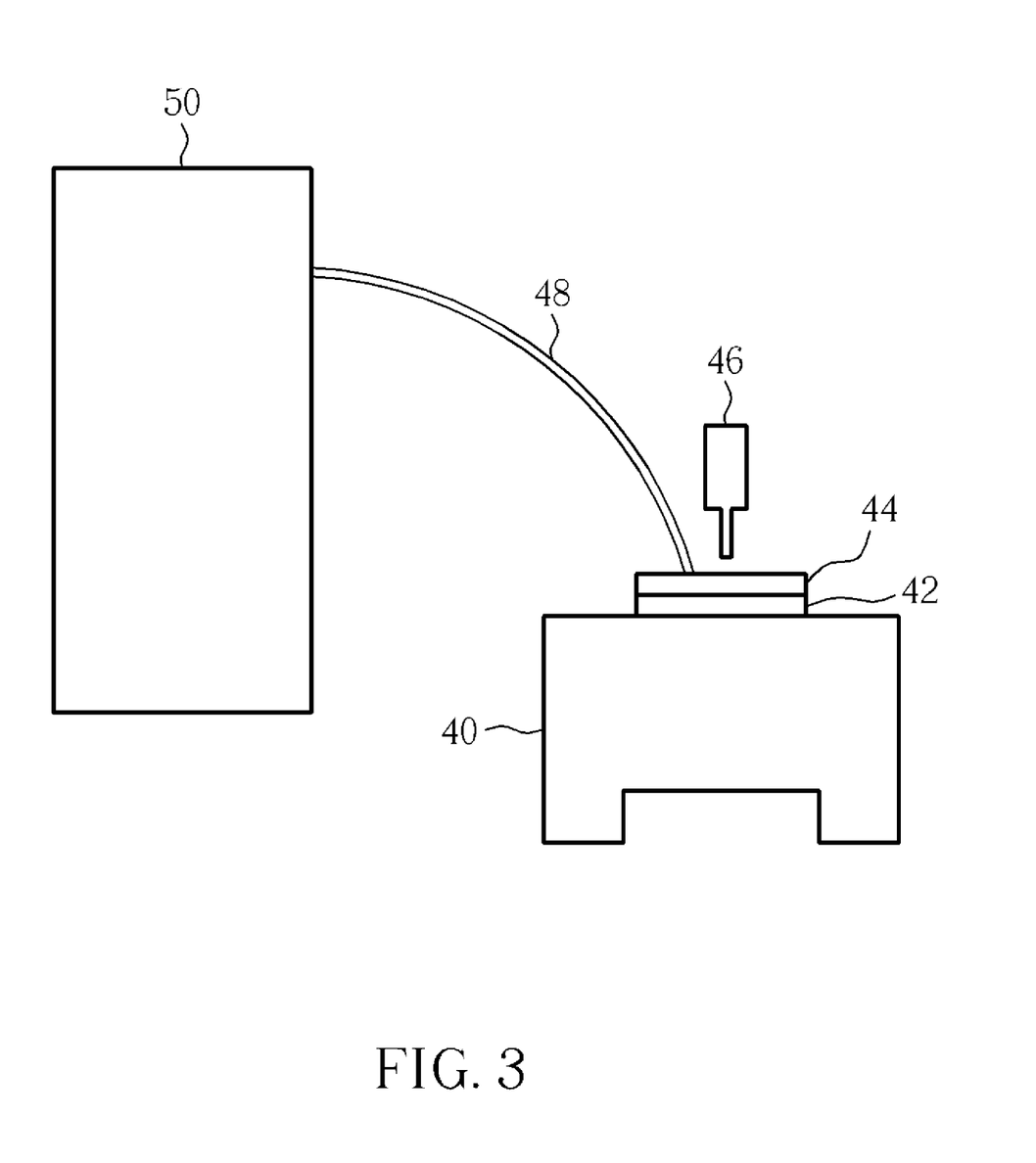
FIG. 3 depicts instruments for a probe test.

FIG. 3 depicts instruments for a probe test. As shown in FIG. 3, a wafer 42 is held by a prober 40. A probe card 44 is positioned on the wafer 42. A microscope 46 is positioned above the probe card 44. Multiple cable 48 over the probe card 44 electrically couple to a tester 50.

Figure 4:
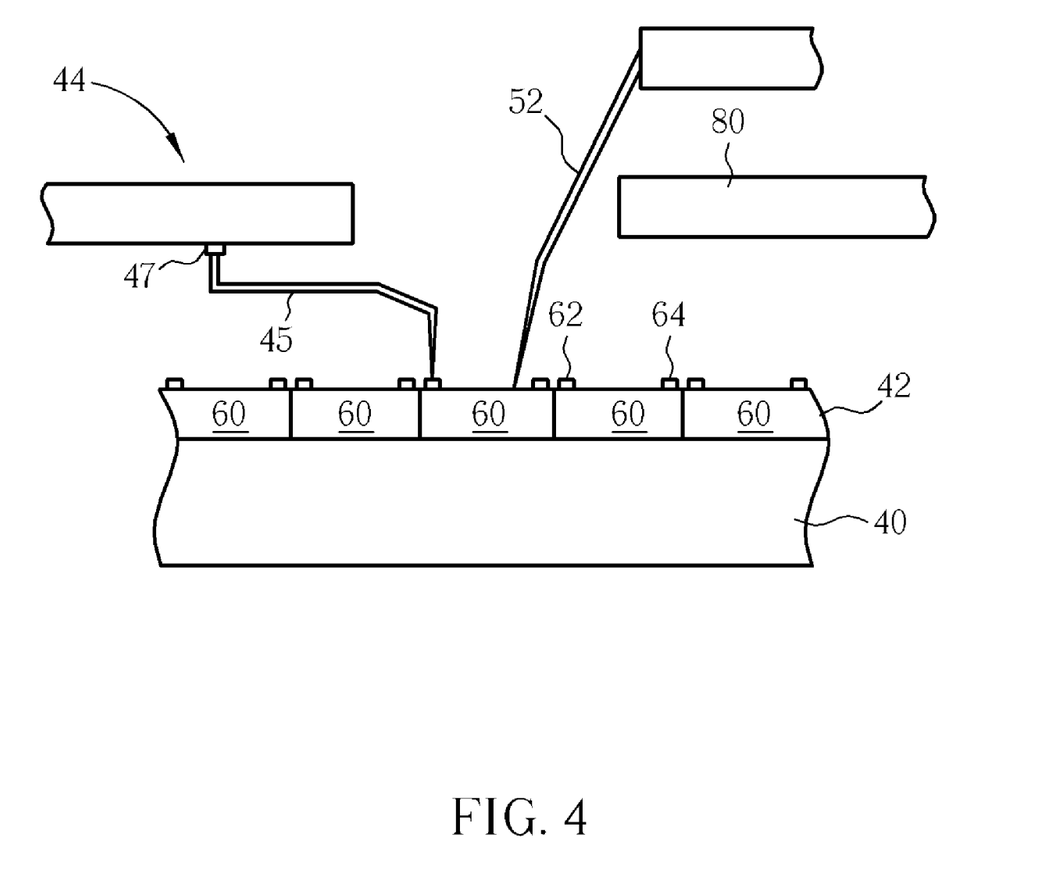
FIG. 4 depicts an enlarged view of several instruments illustrated in FIG. 3.

FIG. 4 depicts an enlarged view of several instruments illustrated in FIG. 3. As shown in FIG. 4, the wafer 42 is held by the prober 40, wherein the wafer 42 includes multiple dies 60. A first pad, such as multiple first row bonding pads 62, is positioned on each of the dies 60. A second pad, such as multiple second row bonding pads 64, is also positioned on each of the dies 60. The probe card 44 positioned above the wafer 42 wherein the probe card 44 includes a PCB 80 and multiple probe needles 45. One end of each of the probe needles 45 contacts the first row bonding pads 62 or the second row bonding pads 64. The other end of each of the probe needles 45 electrically couples to the PCB 80 through multiple solder pads 47. The probe card illustrated in FIG. 4 is the top-side needle type, however, the same principle of probe test can also be applied to the bottom-side needle test and the both-side needle test. When running a probe test, a picoprober 52 can be used to pin the dies 60.

Figure 5:
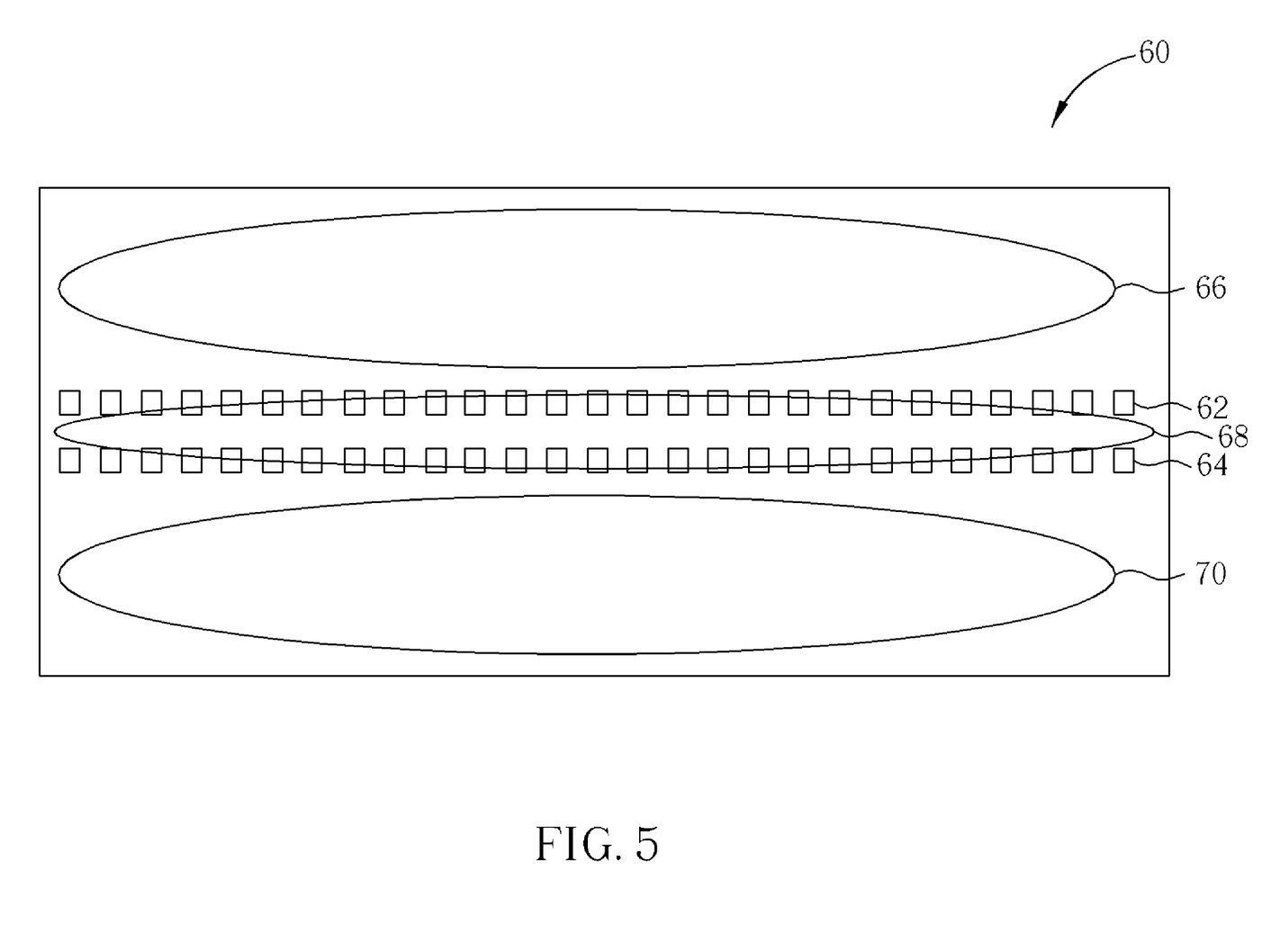
FIG. 5 depicts a top view of the dies illustrated in FIG. 4.

FIG. 5 depicts a top view of the dies 60 illustrated in FIG. 4. As shown in FIG. 5, the first row bonding pads 62 and the second row bonding pads 64 are positioned on the dies 60. Each of the dies 60 is divided into three regions, regions 66, 68, 70. The picoprober 52 will be used to pin regions 66, 68, 70 in the following probe test.

Figure 6:
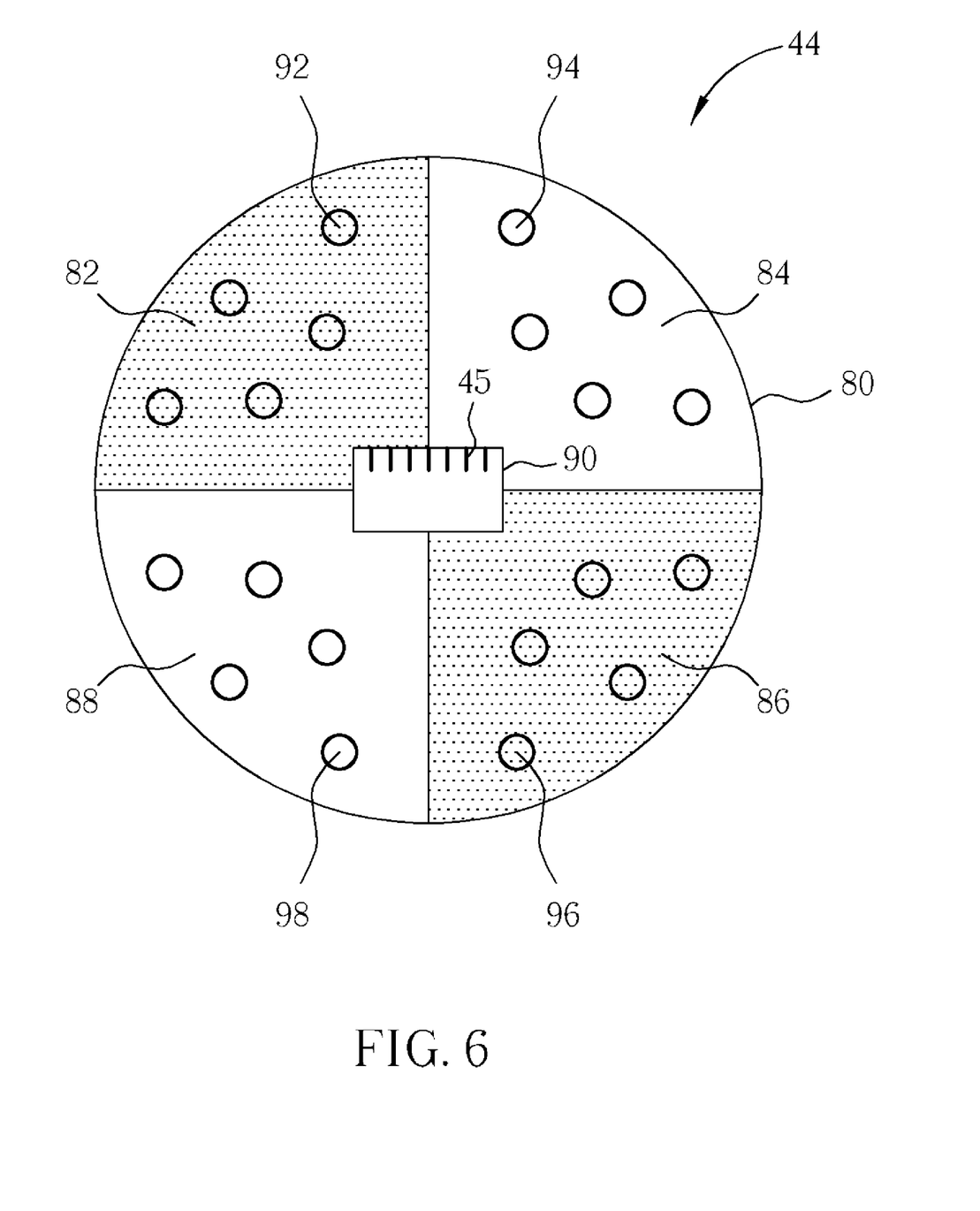
FIG. 6 depicts a top view of the probe card illustrated in FIG. 4.

FIG. 6 depicts a top view of the probe card 44 illustrated in FIG. 4. As shown in FIG. 6, the probe card 44 includes the PCB 80 and the probe needles 45. The PCB 80 includes a first region 82, a second region 84, a third region 86, a fourth region 86 and an opening 90. The opening 90 is positioned in the center of the PCB 80. The probe needles 45, which electrically couple to the PCB 80, can be observed from the opening 90. In addition, multiple first connectors 92 are positioned on the top surface in the first region 82 of the PCB 80. Multiple second connectors 94 are positioned on the top surface in the second region 84 of the PCB 80. Multiple third connectors 96 are positioned on the top surface in the third region 86 of the PCB 80. Multiple fourth connectors 98 are positioned on the top surface in the fourth region 88 of the PCB 80. The connectors mentioned above will be connected to cables in the following probe test in order to couple the PCB 80 to the tester 50.

Please refer to both FIGS. 5 and 6. A circuit pattern corresponding to the first row bonding pads 62 or the second row bonding pads 64 is positioned in the regions 82, 84, 86, 88 respectively. For example, a first circuit pattern (the dotted area in FIG. 6) corresponding to the first row bonding pads 62 is positioned in the first region 82. A second circuit pattern (the un-shaded area in FIG. 6) corresponds to the second row the bonding pads 64 in the second region 84. On the other hand, if the second circuit pattern corresponding to the second row the bonding pad 64 is positioned in the first region 82, then the first circuit pattern corresponding to the first row bonding pad 62 is positioned in the second region 84. In the same way, the first circuit pattern (the dotted area in FIG. 6) corresponding to the first row bonding pads 62 is positioned in the third region 86. The second circuit pattern (the un-shaded area in FIG. 6) corresponding to the second row bonding pads 64 is positioned in the fourth region 88. On the contrary, if the second circuit pattern corresponding to the second row the bonding pad 64 is positioned in the third region 86, then the first circuit pattern corresponding to the first row the bonding pad 62 is positioned in the fourth region 88. It is noteworthy that the first circuit pattern positioned in the first region 82 and the third region 86 respectively correspond to the bonding pads in the same row, such as the first row bonding pads 62. The second circuit pattern positioned in the second region 84 and the fourth region 88 respectively correspond to the bonding pads in the same row, such as the second row bonding pads 64.

In addition, according to another preferred embodiment of the present invention, the circuit pattern in the first region 82 can be different from the circuit pattern in the third region 86, as long as the circuit pattern in the first region 82 and the circuit pattern in the third region 86 correspond to the bonding pads in a same row. In the same way, the circuit pattern in the second region 84 can be different from the circuit pattern in the fourth region 88, as long as the circuit pattern in the second region 84 and the circuit pattern in the fourth region 88 correspond to bonding pads which are in a different row from the bonding pads that the circuit pattern in the first region 82 corresponds to, and as long as the circuit pattern in the second region 84 and the circuit pattern in the fourth region 88 correspond to the bonding pads in a same row.

The PCB 80 can be compatible with the top-side needle type, the bottom-side needle type and the both-side needle type, although the probe needles depicted in FIG. 6 are the top-side needle type. When running the bottom-side needle test or the both-side needle test, by changing the type of the probe needles to the bottom-side needle type or the both-side needle type, the bottom-side needle test or the both-side needle test can be operated. In other words, probe cards with top-side needles, bottom-side needles or both-side needles all use the same PCB 80. In this way, the cost in design PCB can be reduced and the quality of probe test can be more stable.

FIG. 7 to FIG. 10 depict the method by which the top-side needle test, the bottom-side needle test and the both-side needle test are run by the probe card provided in the present invention.

Figure 7:
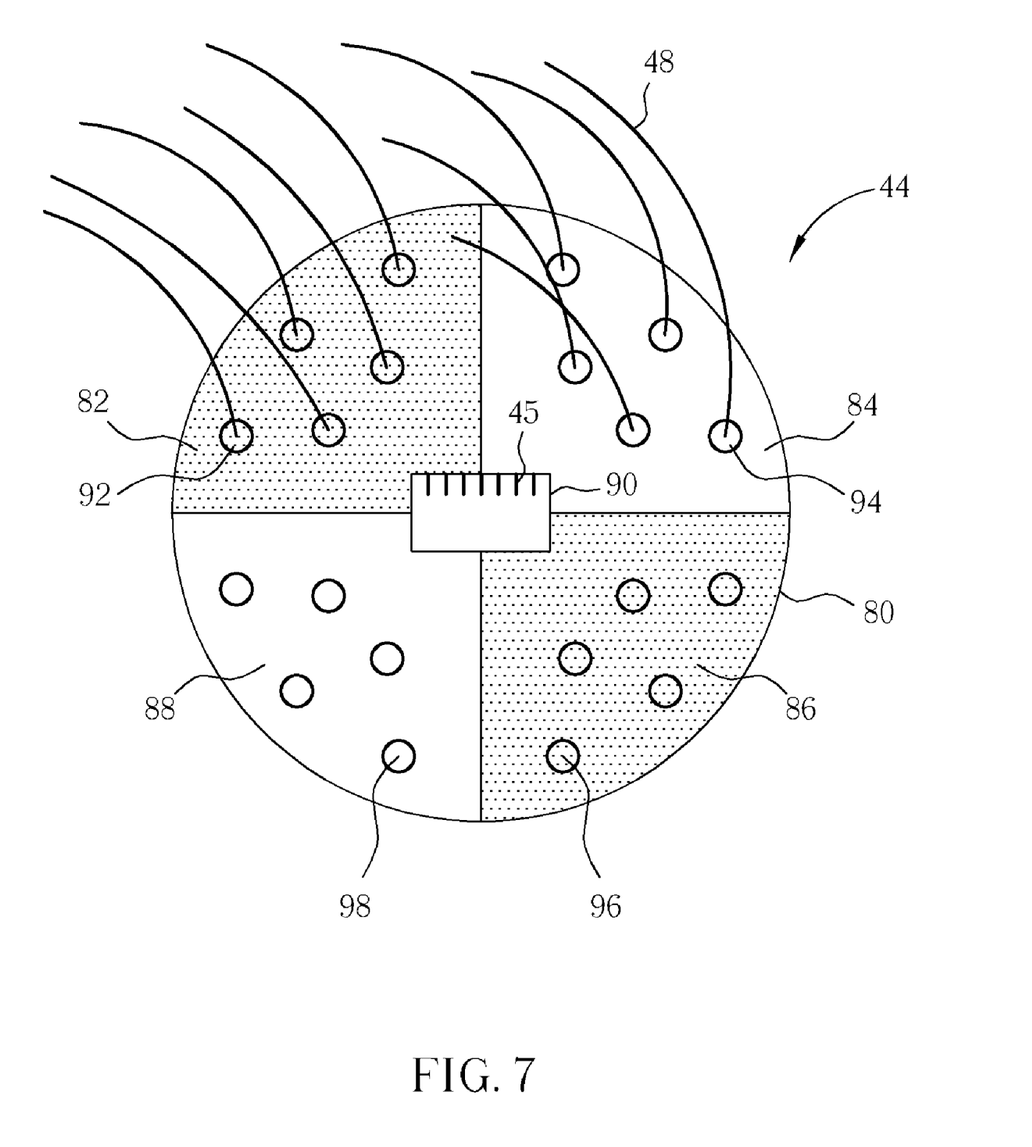
FIG. 7 to FIG. 10 depict the method in which the top-side needle test, the bottom-side needle test and the both-side needle test are run by the probe card provided in the present invention.

FIG. 7 depicts running a top-side needle test by the probe card 44 provided in the present invention. Please refer to FIG. 3, FIG. 5 and FIG. 7 together. When running the top-side needle test, the cables 48 are connected to the first connectors 92 and the second connectors 94. Then, the regions 66, 68 will be covered by the probe needles 45, and the region 70 will be clear for the picoprobe test.

Figure 8:
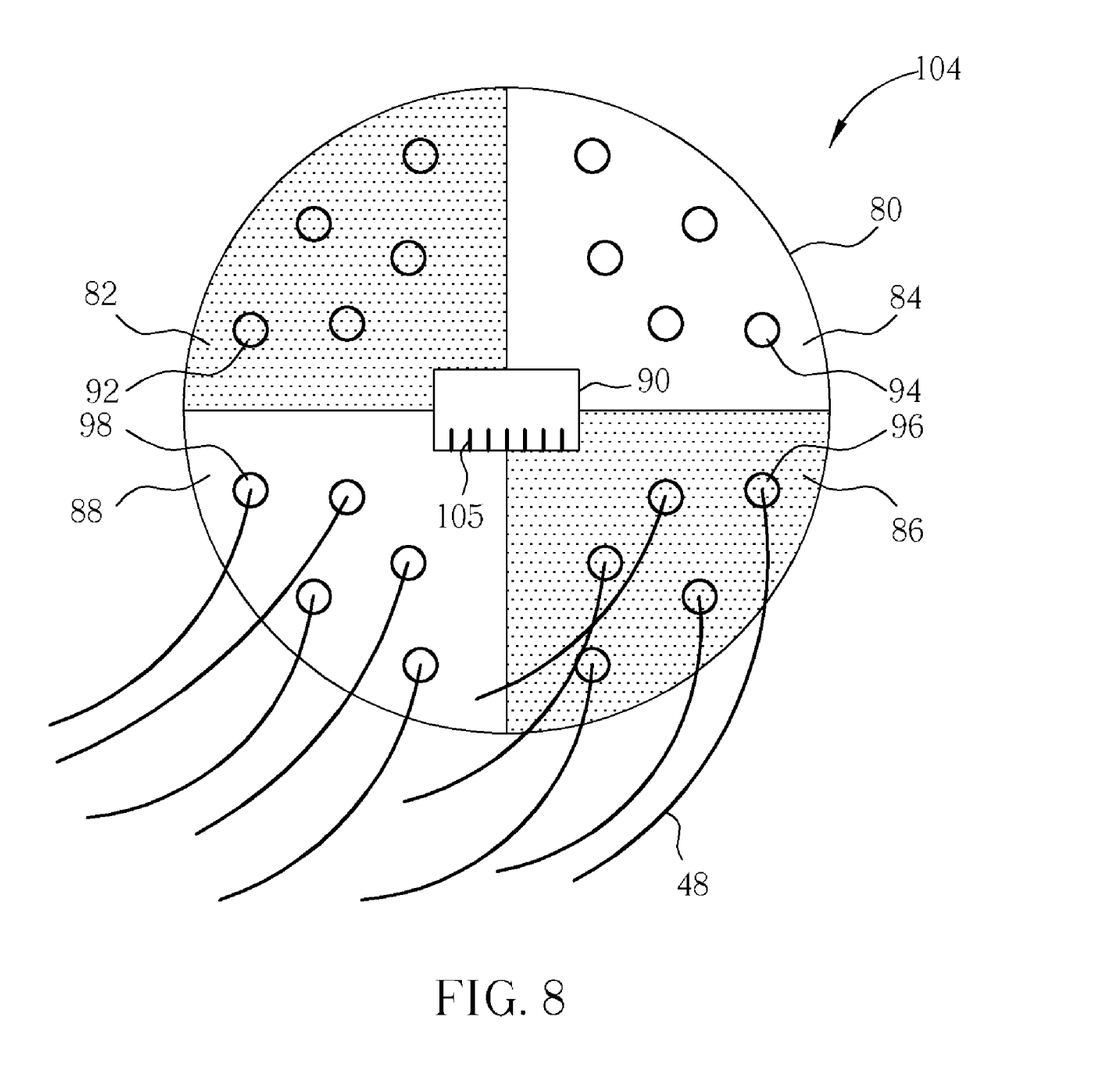

FIG. 8 depicts running a bottom-side needle test by the probe card 104 provided in the present invention. The probe card 104 and the probe card 44 have the same configuration, as both of them have the PCB 80. The difference between the probe card 104 and the probe card 44 is that the probe needles 105 are bottom-side needles. Please refer to FIG. 3, FIG. 5 and FIG. 8 together. When running the bottom-side needle test, the cables 48 are connected to the third connectors 96 and the fourth connectors 98. Then the regions 68, 70 will be covered by the probe needles 105, and the region 66 will be clear for the picoprober test.

Figure 9:
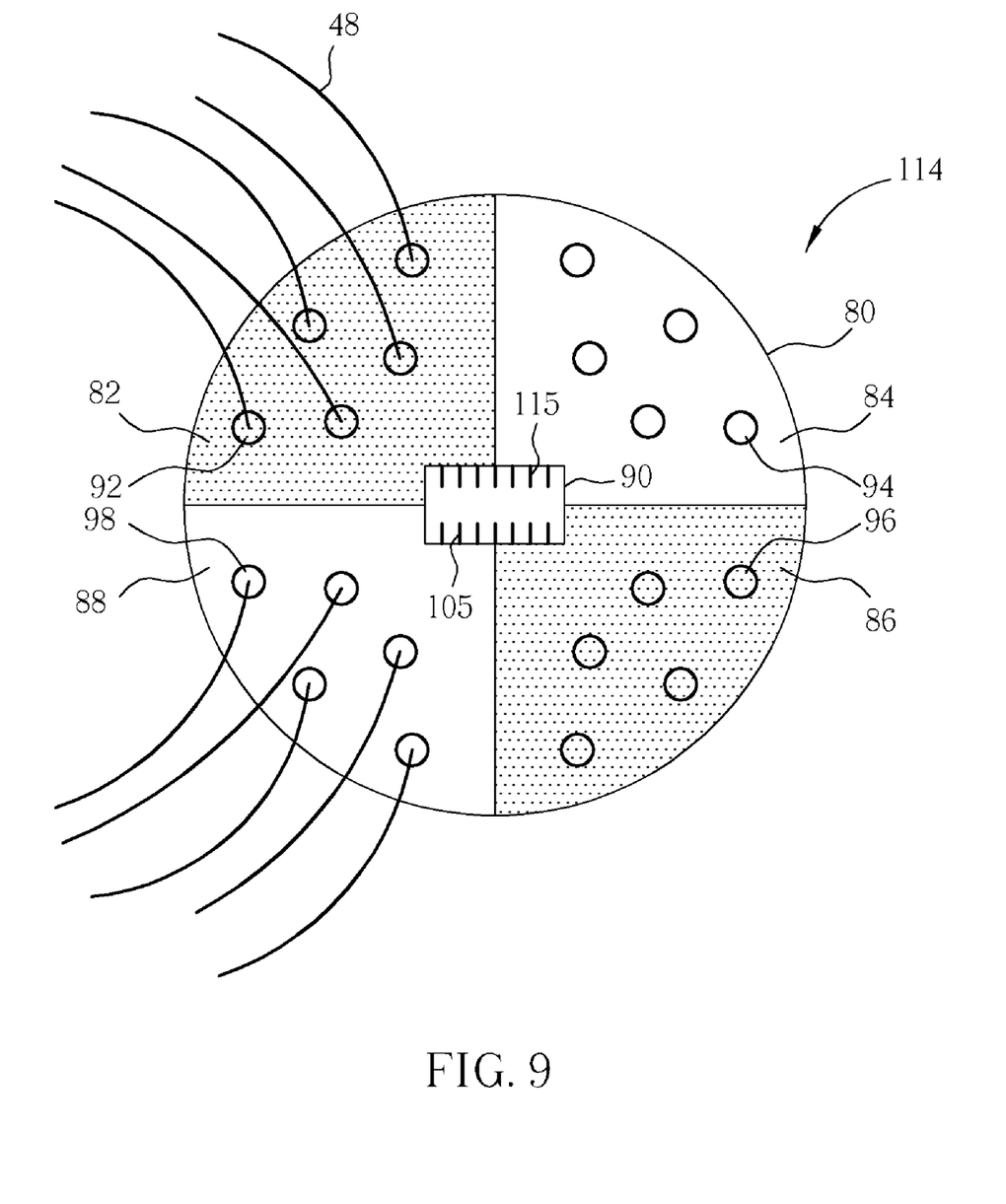

FIG. 9 depicts running a both-side needle test by the probe card 114 provided in the present invention. The probe card 114 and the probe card 44 have the same configuration, as both of them have the PCB 80. The difference between the probe card 114 and the probe card 44 is that the probe needles 115 are both-side needles. Please refer to FIG. 3, FIG. 5 and FIG. 9 together. When running the both-side needle test, the cables 48 are connected to the first connectors 92 and the fourth connectors 98. The regions 66, 70 will be covered by the probe needles 115, and the region 68 will be clear for the picoprober test.

Figure 10:
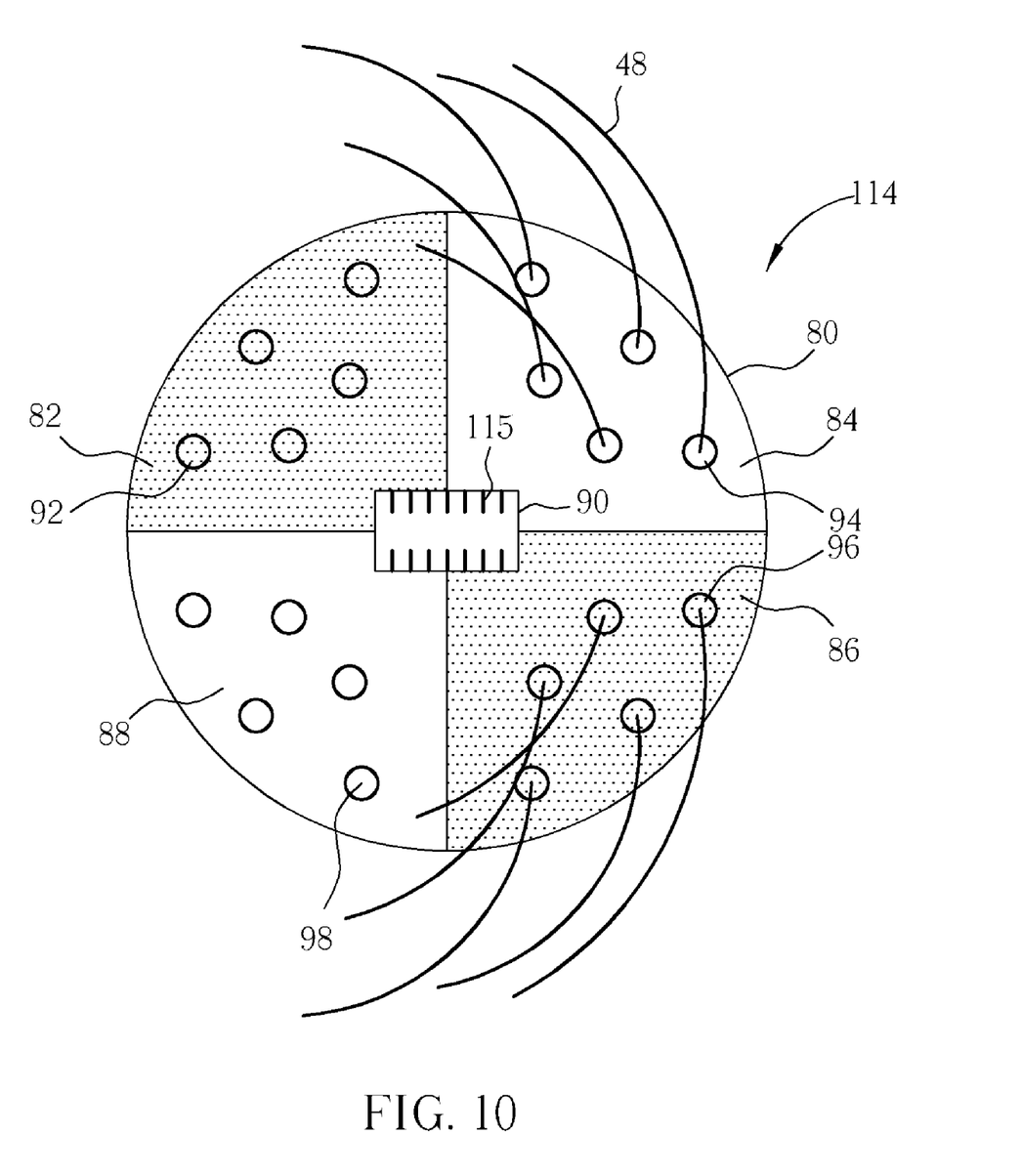

FIG. 10 depicts another preferred embodiment of running a both-side needle test by the probe card 114 provided in the present invention. The probe card 114 and the probe card 44 have the same configuration, as both of them have the PCB 80. The difference between the probe card 114 and the probe card 44 is that the probe needles 115 are both-side needles. Please refer to FIG. 3, FIG. 5 and FIG. 10 together. When running the both-side needle test, the cables 48 are connected to the second connectors 94 and the third connectors 96. The regions 66, 70 will be covered by the probe needles 115, and the region 68 will be clear for the picoprober test.

As described above, the PCB 80 provided in the present invention can be made into a probe card with top-side needles, bottom-side needles or both-side needles according to different requirements. Therefore, the cost in PCB design is reduced and a more stable probe test can be achieved.

Those skilled in the art will readily observe that numerous modifications and alterations of the device and method may be made while retaining the teachings of the invention.

What is claimed is:

1. A probe card comprising:
   a printed circuit board (PCB), wherein the printed circuit board comprises:
      a first region formed on the printed circuit board and provided with a first circuit pattern;
      a second region formed on the printed circuit board and provided with a second circuit pattern;
      a third region formed on the printed circuit board and provided with a third circuit pattern;
      a fourth region formed on the printed circuit board and provided with a fourth circuit pattern, wherein the first region, the second region, the third region and the fourth region are arranged clockwise on the printed circuit board, the first circuit pattern corresponds to the third circuit pattern and the second circuit pattern corresponds to the fourth circuit pattern;
      a plurality of connectors positioned on the printed circuit board and in the first region, the second region, the third region and the fourth region, where the connectors are connected to a tester electrically via a plurality of cables; and
      an opening positioned in the center of the printed circuit board; and
   a plurality of probe needles coupled to the printed circuit board electrically.

2. The probe card according to claim 1, wherein the probe needles are top-side needles.

3. The probe card according to claim 1, wherein the probe needles are bottom-side needles.

4. The probe card according to claim 2, wherein the probe needles also comprise bottom-side needles.

5. The probe card according to claim 1, wherein the probe needles are both-side needles.

6. The probe card according to claim 4, wherein the probe needles couple to the printed circuit board via a plurality of solder pads positioned on the bottom surface of the printed circuit board.

7. The probe card according to claim 6, wherein the first circuit pattern and the third circuit pattern correspond to a plurality of first row bonding pads adapted to be positioned on a die.

8. The probe card according to claim 7, wherein the second circuit pattern and the fourth circuit pattern correspond to a plurality of second row bonding pads adapted to be positioned on the die.

9. In a probe card comprising a printed circuit board (PCB), wherein the improvements comprise:
   a first region adapted to be formed on the printed circuit board and comprising a first circuit pattern;
   a second region adapted to be formed on the printed circuit board and comprising a second circuit pattern;
   a third region adapted to be formed on the printed circuit board and comprising a third circuit pattern;
   a fourth region adapted to be formed on the printed circuit board and comprising a fourth circuit pattern, wherein the first region, the second region, the third region and the fourth region are arranged clockwise, and wherein the first circuit pattern and the third circuit pattern correspond to a first pad adapted to be formed on the printed circuit board, and wherein the second circuit pattern and the fourth circuit pattern correspond to a second pad adapted to be formed on the printed circuit board; and
   an opening positioned in the center of the PCB.

10. The PCB according to claim 9, wherein the first pad comprises a plurality of first row bonding pads positioned on a die.

11. The PCB according to claim 10, wherein the second pad comprises a plurality of second row bonding pads positioned on the die.

* * * * *